United States Patent [19]
Murakami et al.

[11] Patent Number: 4,704,020
[45] Date of Patent: Nov. 3, 1987

[54] PROJECTION OPTICAL APPARATUS

[75] Inventors: Masaichi Murakami, Tokyo; Hidemi Kawai, Kawasaki; Kyoichi Suwa, Yokohama, all of Japan

[73] Assignee: Nippon Kogaku K. K., Tokyo, Japan

[21] Appl. No.: 903,500

[22] Filed: Sep. 4, 1986

[30] Foreign Application Priority Data

Sep. 9, 1985 [JP] Japan ................................ 60-197696

[51] Int. Cl.⁴ ............................................. G01B 11/26
[52] U.S. Cl. ...................................... 353/122; 355/53; 356/152
[58] Field of Search ....................... 356/152, 1; 355/53, 355/54; 353/121, 122

[56] References Cited

U.S. PATENT DOCUMENTS 4,540,277 9/1985 Mayer et al. ........................... 355/53
4,558,949 12/1985 Uehara et al. ......................... 356/152
4,577,958 3/1986 Phillips ............................... 355/45 X Primary Examiner—Harry N. Haroian
Attorney, Agent, or Firm—Shapiro and Shapiro

[57] ABSTRACT

A projection optical apparatus for projecting the pattern of a mask onto a substrate through a projection optical system includes a stage for supporting thereon a substrate having a plurality of marks for detection on the surface thereof, first detecting means for detecting the amount of inclination of the surface of the substrate relative to the surface on which the pattern is projected and imaged, through the projection optical system, second detecting means for detecting the amount of inclination of the surface of the substrate relative to a predetermined reference plane independently of the projection optical system, and calibrating means for calibrating the amount of inclination detected by the second detecting means on the basis of the amount of inclination detected by the first detecting means.

5 Claims, 22 Drawing Figures

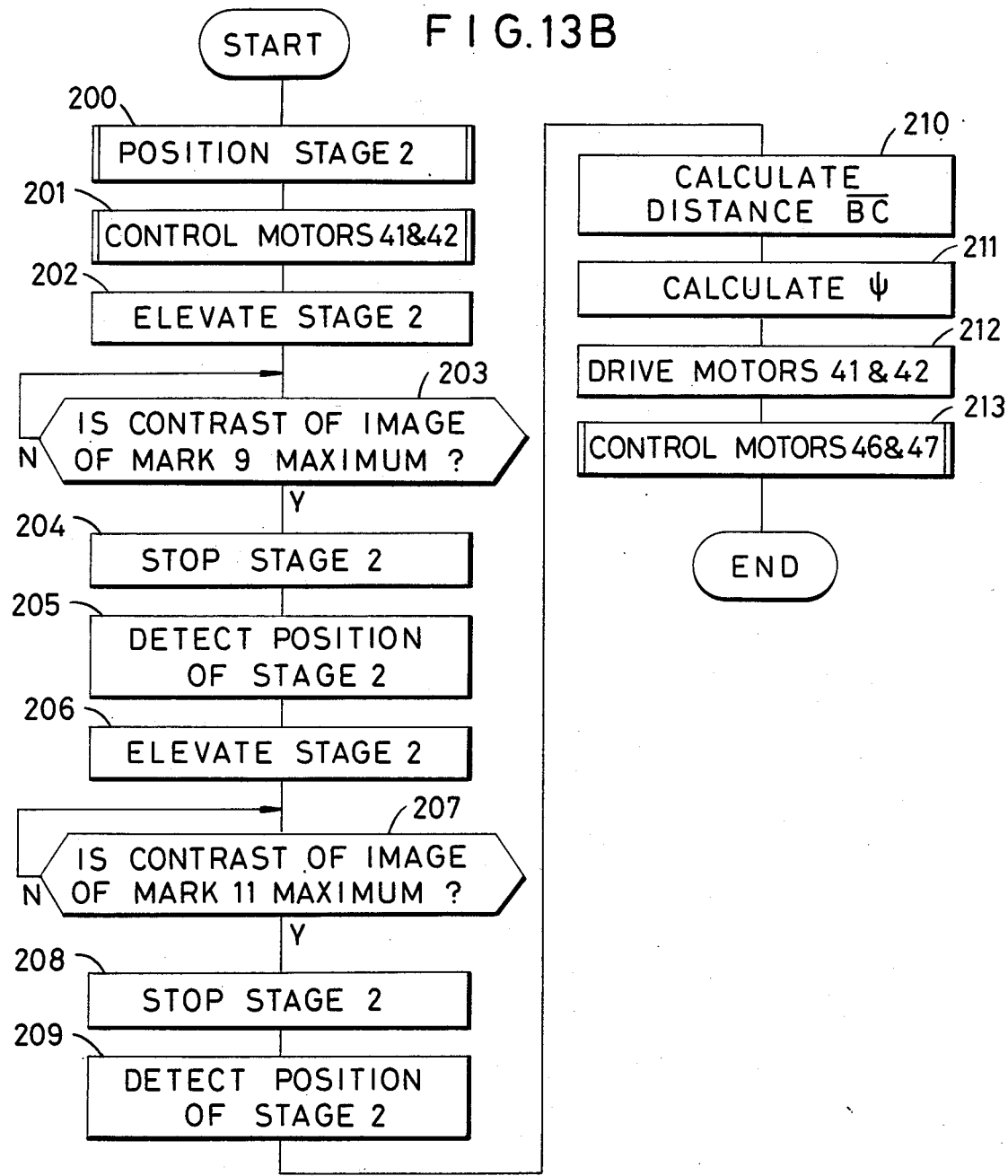

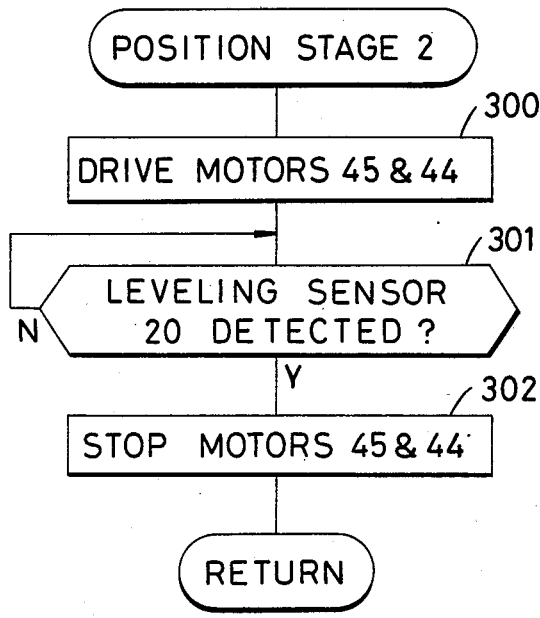
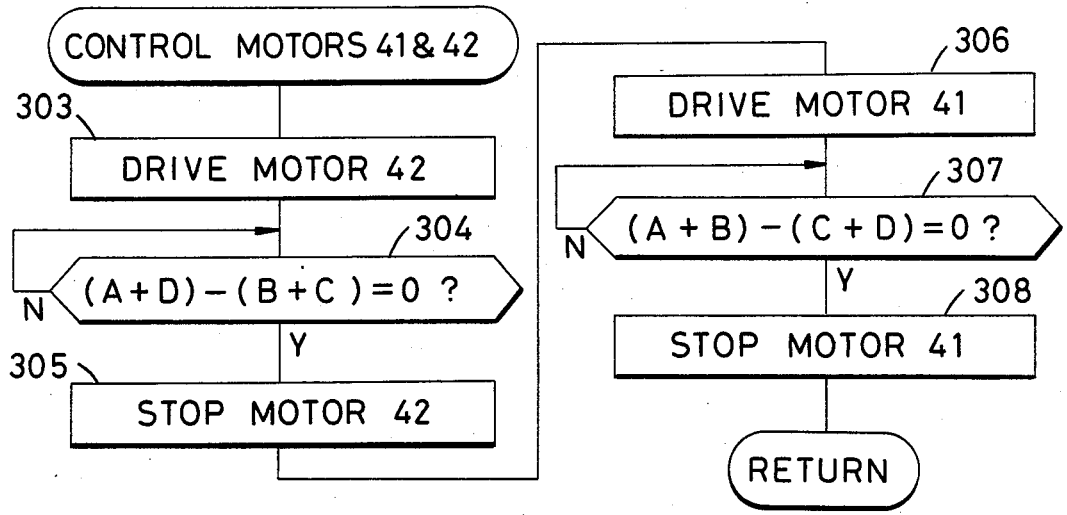

PROJECTION OPTICAL APPARATUS

BACKGROUND OF THE INVENTION

1. Field of the Invention

This invention relates to a projection optical apparatus for projecting the pattern of a mask onto a semiconductor wafer for the manufacture of a semiconductor device such as an integrated circuit, and in particular to a projection optical apparatus provided with an inclination angle measuring system capable of measuring the absolute angle of inclination of the surface of the semiconductor wafer relative to the projection optic axis.

2. Related Background Art

Generally, in a projection optical apparatus used for the manufacture of integrated circuits, a projection objective having a great numerical aperture (N.A.) is used to form a minute circuit pattern image of the surface of a wafer and therefore, unless the exposed area of the wafer is maintained in a position accurately perpendicular (horizontal) to the optic axis of the projection objective having a very small allowable depth of focus and installed upright, a minute and clear-cut pattern image cannot be obtained. Particularly, in larger sizes of wafer and a new material such as gallium-arsenic replacing silicon, the planarity of the wafer itself is unstable and therefore, detection of the partial horizontal position of the wafer is required.

A horizontal position (level) measuring method is disclosed, for example, in Japanese Laid-Open patent application No. 113706/1983 (U.S. application Ser. No. 419,514, filed on Sept. 17, 1982) now U.S. Pat. No. 4,558,949. The method disclosed in this publication is a wafer surface inclination measuring system in which an off-axis and parallel light beam is applied to the surface of a sample, i.e., the surface of a semiconductor wafer and the reflected light therefrom is detected, whereby the average inclination in the exposed area relative to the optic axis is measured.

In this system, however, to find out the reference angle of inclination of the wafer, i.e., the angle of inclination of the wafer relative to the projection optic axis for which the sensor output becomes zero, it is necessary to repetitively effect the operation of effecting projection exposure processing for the wafer while changing the inclination of the wafer surface, thereby examining whether the projected pattern is uniformly well resolved over the entire projection range and effecting adjustment. Also, once the reference angle of inclination is determined, the exposure for the wafer must again be effected with respect to the relative change of the projection optic axis and the measuring system thereafter, and the adjustment thereof is cumbersome and very inconvenient and thus, means capable of making the most of the method which can determine the reference angle of inclination without effecting the projection exposure and applies an off-axis and parallel light beam to the surface of the smaple is desired.

On the other hand, a level measuring mehtod called the TTL auto leveling in which the inclination of the wafer is measured through a projection objective is also known. In this method, the contrast of a reticle mark projected onto a wafer is measured at four locations in the projection field, and chip leveling is effected with the surface on which the maximum value of each contrast is obtained as the optimum imaging plane. However, such TTL type level measuring method has the following inconveniences:

(1) The contrast is measured only at four points and therefore, it does not always represent the inclination of the entire surface.

(2) When the reticle mark is projected onto the wafer surface circuit, it is liable to be affected by the uneveness of the ground and thus, it is necessary to effect measurement while avoiding the uneven surface.

SUMMARY OF THE INVENTION

It is therefore an object of the present invention to overcome the above-noted disadvantages peculiar to the apparatus according to the prior art and to provide a projection optical apparatus which can well and relatively simply correct or calibrate the inclination of a mask and the surface of a wafer relative to the projection optic axis without projecting the pattern of the mask onto the photosensitive surface of the wafer.

To achieve the above object, the projection optical apparatus according to the present invention is characterized by a stage for supporting thereon a substrate provided on the stage and having a plurality of marks for detection on the surface thereof, first detecting means for detecting the amount of inclination of the surface of the substrate relative to the surface on which the pattern is projected and imaged, through a projection optical system, second detecting means for detecting the amount of inclination of the surface of said substrate relative to a predetermined reference plane independently of said projection optical system, and calibrating means for calibrating the amount of inclination detected by said second detecting means on the basis of the amount of inclination detected by said first detecting means.

Said first detecting means detects the surface on which the pattern is projected and imaged and the marks for detection on the substrate through the mask and the projection optical system, elevates or lowers the stage, measures the spacings between the respective marks for detection and the surface on which the pattern is projected and imaged, and detects the amount of inclination of the substrate relative to the surface on which the pattern is projected and imaged. On the other hand, said second detecting means detects the amount of inclination of the surface of said substrate relative to a predetermined reference plane independently of said first detecting means. The amount of inclination detected by said second detecting means is calibrated on the basis of the amount of inclination detected by said first detecting means, and in accordance therewith, the inclination of the substrate is modified with the stage being inclined.

The inclination of the stage can be modified in this manner and therefore, it is not necessary to project the pattern onto the photosensitive surface of the wafer and examine the inclination of the wafer from the degree of resolution of the resultant pattern image, and even during the exposing step of the wafer, the substrate, instead of the wafer, can be inserted into the projection optical apparatus, whereby the inclination can be examined or automatically modified.

Thus, according to the present invention, irrespective of the presence or absence of the projection image plane by the projection optical system, the inclination of the surface of the semiconductor wafer can be well corrected. The substrate may be the semiconductor wafer itself if it has marks for detection.

Other objects, features and effects of the present invention will become fully apparent from the following detailed description taken in conjunction with the accompanying drawings.

BRIEF DESCRIPTION OF THE DRAWINGS

FIG. 13B is a flow chart showing the operation of the embodiment of the present invention.

FIG. 13C is a flow chart of the subroutine shown at step 200 of FIG. 13B.

FIG. 13D is a flow chart of the subroutine shown at step 201 of FIG. 13B.

DESCRIPTION OF THE PREFERRED EMBODIMENTS

Figure 1:
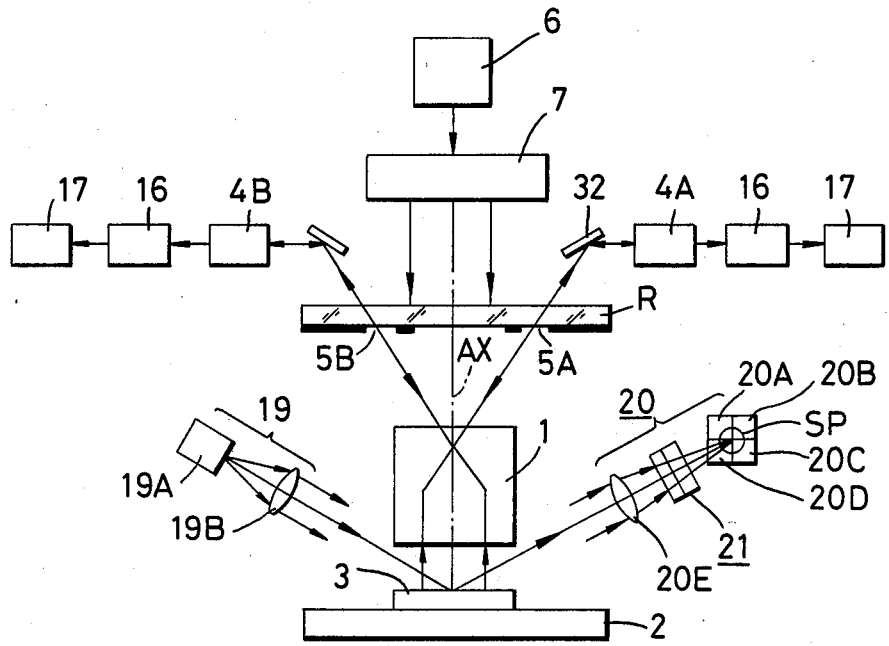
FIG. 1 shows the construction of an optical system according to an embodiment of the present invention.
Figure 2:
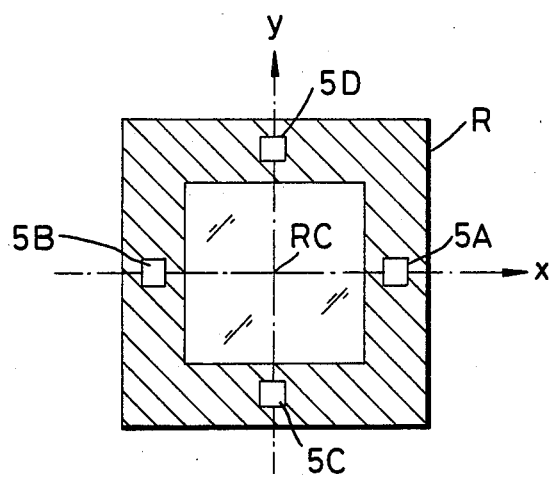
FIG. 2 is a plan view showing an example of the reticle shown in FIG. 1.

FIG. 1 schematically shows the construction of an exposure apparatus used in a first embodiment of the present invention. In FIG. 1, a reticle R is disposed on the object side of a projection lens 1, and TTL detecting optical systems 4A and 4B are disposed so that a wafer stage 2 can be observed through openings 5A and 5B on the reticle, R. Similar optical systems are also disposed in a direction perpendicular to the plane of the drawing sheet so that the wafer stage 2 can be observed through openings 5C and 5D shown in FIG. 2. A mirror surface 3 is provided on the wafer stage 2 which is three-dimensionally movable. As the mirror surface 3, use is made of the surface (chromiun surface) of a reference mark plate provided with a reference mark used to calibrate, for example, the alignment system of the apparatus. In FIG. 2, openings 5A, 5B, 5C and 5D are disposed on the x-axis and y-axis, respectively, when an xy coordinates system having the center RC of the reticle R as the origin is defined. Also, the reticle R is uniformly illuminated by the illuminating light beam from an illuminating light source 6 for exposure through an illuminating optical system 7.

Figure 3:
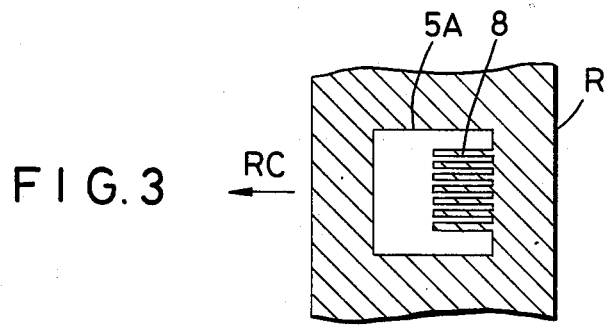
FIG. 3 is a plan view showing an example of the mark formed in the opening of the reticle shown in FIG. 2.
Figure 4:
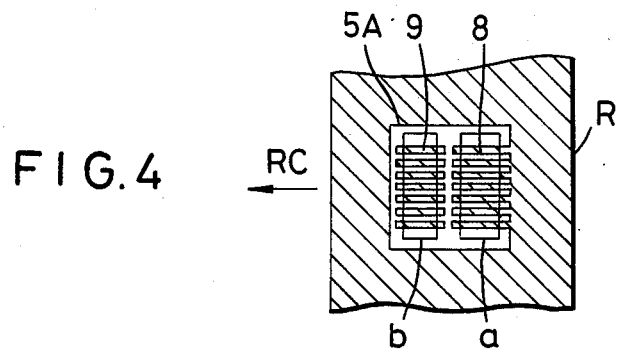
FIG. 4 illustrates a state in which the marks are seen by means of the TTL detecting optical system shown in FIG. 1 through the opening of the reticle.
Figure 5:
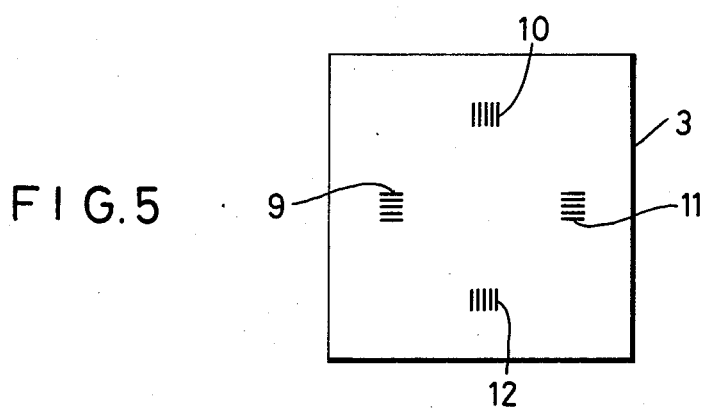
FIG. 5 is a plan view showing an example of the mark provided on the mirror surface shown in FIG. 1.

A grating-like pattern 8 as shown in FIG. 3 is formed in each of the openings 5A and 5B on the reticle R, and on the other hand, a grating-like pattern 9 adapted to lie in the opening 5A of the reticle R as shown in FIG. 4 when the wafer stage 2 has come to a predetermined position is formed on the mirror surface 3, as shown in FIG. 5. Also, grating-like patterns 10, 11 and 12 are formed on the mirror surface 3 so that a stage similar to that of FIG. 4 is also provided with respect to the other openings 5B, 5C and 5D when the wafer stage 2 is in such position (see FIG. 5).

The TTL detecting optical systems will now be described in detail with reference to FIG. 6. The apparatus which will hereinafter be described is a detecting apparatus in which patterns 8 and 9–12 as shown in FIGS. 3 and 5 are formed on the reticle R and the mirror surface 3 and which utilizes the contrast difference between video signals obtained by observing said patterns through an industrial television camera (iTV) 15 as shown in FIG. 4. In this apparatus, the mirror surface 3 on the stage 2 is designed such that the vertically moved position thereof relative to Z direction can be measured by sensor means, not shown, and during the measurement, the stage 2 is not moved in x and y directions. Also, the marks 9 to 12 on the mirror surface 3 are formed as focusing marks (grating-like patterns) at positions corresponding to the openings 5A, 5B, 5C and 5D on the reticle R.

Figure 6:
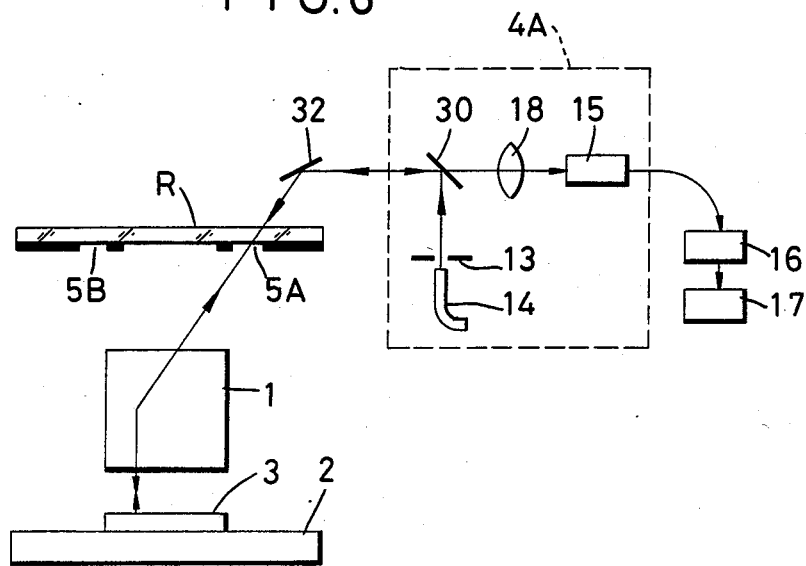
FIG. 6 is a block diagram showing an example of the construction of the TTL detecting system shown in FIG. 1.

In FIG. 6, the illuminating light for TTL detection is directed from a light source, not shown, by an optical fiber 14 and is transmitted toward the opening 5A on the reticle R through a half-mirror 30 and a reflecting mirror 32. A field stop 13 is provided at a suitable location between the half-mirror 30 and the optical fiber 14 so that only the opening 5A on the reticle R is illuminated.

The light reflected by the mirror surface 3 enters an imaging lens 18 via the reflecting mirror 32 and the half-mirror 30 and is imaged on the industrial television camera (iTV) 15. A control circuit 17 is connected to the industrial television camera (iTV) 15 through a picture signal processing circuit 16. Four sets of the above-described portions are provided correspondingly to the respective openings 5A, 5B, 5C and 5D of the reticle R.

Figure 7:
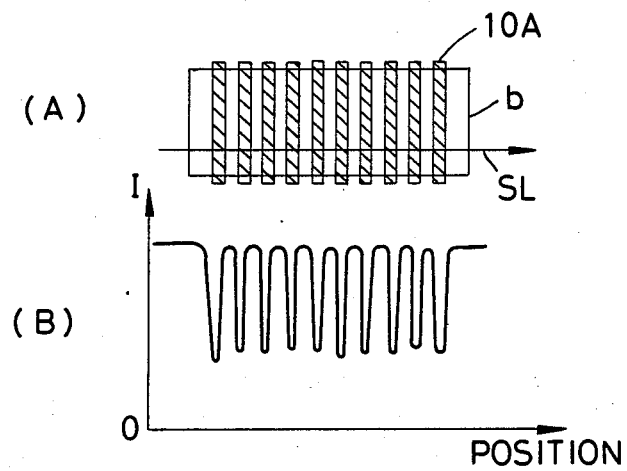
FIG. 7 illustrates the output of the ITV camera shown in FIG. 1, FIG. 7(A) showing the mark image of the mirror surface formed by the ITV camera, and FIG. 7(B) showing the wave form of a video signal put out from the ITV camera.

The industrial television camera 15 is designed to be capable of photographing the areas a and b in FIG. 4 at a time, and a video signal I corresponding to the scanning line SL of the area b shown, for example, in FIG. 7(A), in such as shown in FIG. 7(B).

The adjustment of the above-described apparatus will now be described. The grating pattern 8 of the opening 5A of the reticle R shown in FIG. 3 is first picked up and scanned by the industrial television camera 15 and the contrast of the wave form as shown in FIG. 7(B) is examined from the picture signal thereof, and the lens 18 is adjusted in the direction of the optic axis so that the contrast becomes maximum. The grating pattern 8 is set to a line width approximate to the resolving powers of the lens 18 and the industrial television camera 15. By the above-described operation, the focusing of the reticle R and the image pickup surface of the industrial television camera 15 is accomplished.

Subsequently, the mark 9 on the mirror surface 3 is focused through the projection objective 1 and the lens 18 by vertically moving the mirror surface 3. By this operation, the focusing of the image pickup surface of the industrial television camera 15, the reticle R and the mirror surface 3 is accomplished at a time. That is, the industrial television camera 15 can pick up the mark images of both of the areas a and b of FIG. 4 with the best contrast.

Also, in the above-described adjustment, where image pickup (scanning) is to be effected in the area a, the illuminating light transmitted through the grating pattern 8 in the opening 5A on the reticle R is reflected by the mirror surface 3 and the grating pattern 8 is illuminated from the back side thereof, i.e., from the projection lens 1 side. However, assuming that the projection lens 1 is non-telecentric on the reticle R side as shown in FIG. 1, the direct reflected light from the grating pattern 8 does not return to the television system and looks black in a bright picture plane. On the other hand, where the picture signal is to be read in the area b, the contrast of the image of the mark 9 on the mirror surface 3 is detected.

Further, the respective grating patterns 8 in the openings 5A, 5B, 5C and 5D of the reticle R, as shown in FIGS. 2 and 5, may preferably be contrast-detected at a time by the respective TTL detecting optical systems without the stage 2 being moved. This is because even if the stage 2 is moved so that the marks 9, 10, 11 and 12 on the mirror surface 3 underlie the respective optical systems, if a holder or the like holding the stage 2 and the mirror surface 3 is inclined, the result of the measurement will vary with that movement and the measurement will become meaningless.

Figure 8:
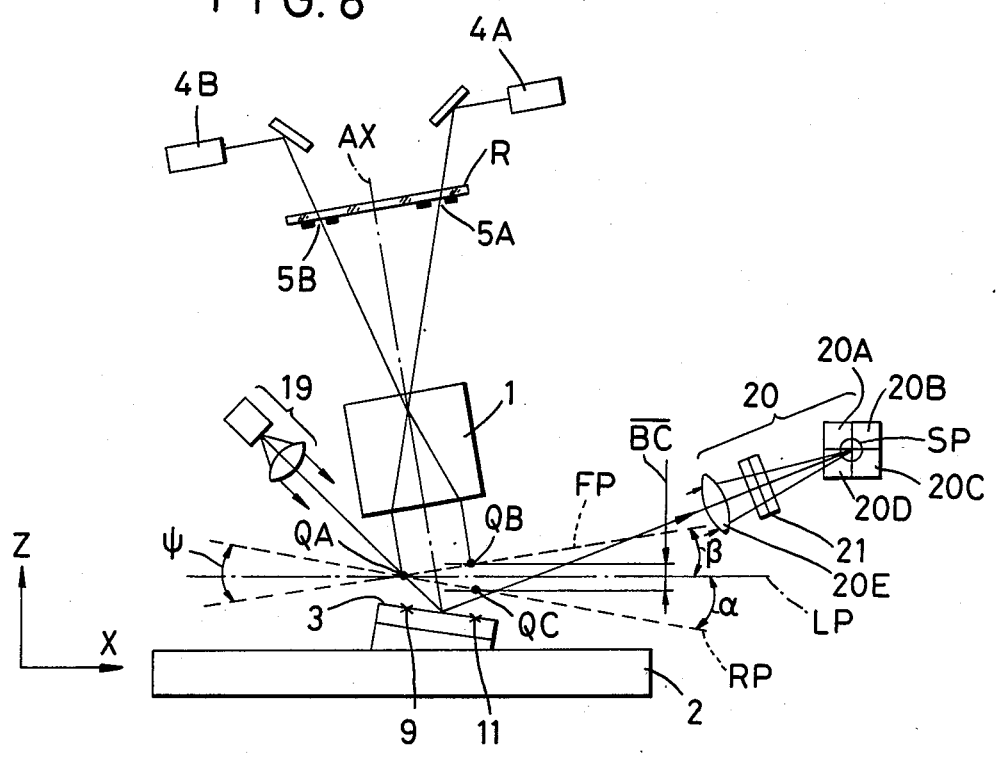
FIG. 8 illustrates the state during the correction of the inclination in the embodiment of FIG. 1.

Here, it is to be understood that the imaging optic axis AX of the projection lens 1 is inclined by an angle $\beta$ with respect to the horizontal plane of movement of the stage 2 and the mirror surface 3 is inclined by an angle $\alpha$ with respect to said horizontal plane of movement. Such a case is shown in FIG. 8. In FIG. 8, when the imaging plane of the reticle R is defined as FP and the horizontal plane of movement of the stage 2 is defined as LP, the angle $\beta$ is also the angle of inclination of the imaging plane FP with respect to the plane of movement LP. Further, in FIG. 8, an autoleveling sensor as disclosed in Japanese Laid-Open patent application No. 113706/1983 is constituted by a light-transmitting system 19 and a light-receiving system 20, and a zero point correction device 21 is disposed in the optical path between the light-receiving system 20 and the stage 2. The light-transmitting system 19 emits a light of a wavelength which will not sensitize the photoresist applied to the wafer.

Figure 9:
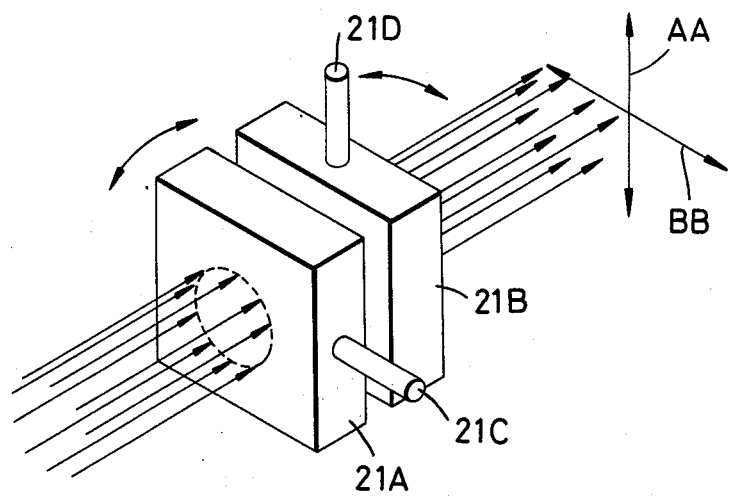
FIG. 9 is a perspective view of plane parallel plates used in the auto-leveling sensor portion shown in FIG. 1.
Figure 10A:
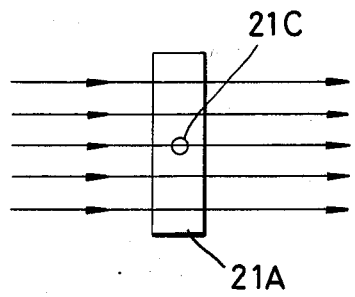
FIGS. 10A and 10B illustrate the action of the plain parallel plate shown in FIG. 9.
Figure 10B:
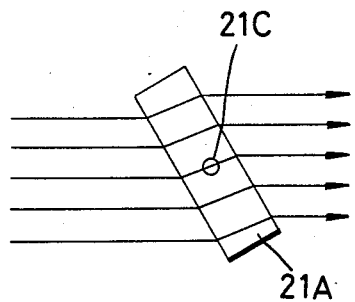
Figure 11:
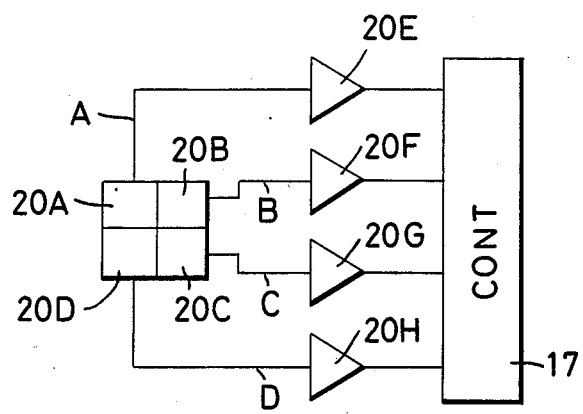
FIG. 11 is a circuit diagram for illustrating the operation of the auto-leveling sensor shown in FIG. 1.

FIGS. 9 to 11 show an example of the construction of such auto-leveling sensor portion in detail. The zero point correction device 21 includes plane parallel plates 21A and 21B shown in FIG. 9. The plane parallel plates 21A and 21B are designed so as to be rotatable about shafts 21C and 21D, respectively, by motors 41 and 42 which will be described later. When the plane parallel plates are disposed perpendicularly to a parallel light beam as shown in FIG. 10A, they transmit the light beam therethrough, and when the plane parallel plates are disposed obliquely with respect to the parallel light beam as shown in FIG. 10B, the light beam shifts. As shown in FIG. 9, when the plane parallel plate 21A is inclined, the light beam shifts in the direction of arrow AA, and when the plane parallel plate 21B is inclined, the light beam shifts in the direction of arrow BB. Accordingly, the light beam can be shifted two-dimensionally by suitable adjusting the inclinations of both of the plane parallel plates 21A and 21B.

Also, the light-receiving system 20 has four-division light-receiving elements 20A, 20B, 20C and 20D, which are connected to a processing circuit 17 through amplifiers 20E, 20F, 20G and 20H, respectively, as shown in FIG. 11. As previously described, the light transmitted through the zero point correction device 21 enters so as to form a spot SP substantially at the center of the four-division light-receiving elements 20A–20D, and design is made such that the degree of the shift of the spot of the incident light beam can be two-dimensionally detected from the difference between the outputs of the light-receiving elements 20A, 20B, 20C and 20D. Of course, these four-division light-receiving elements 20A–20D also detect the inclinations of the mirror surface 3 and the surface of the wafer. As is disclosed in Japanese Laid-Open patent application No. 113706/1983, the light-transmitting system 19 comprises a light source 19A and a lens 19B and applies a parallel light beam obliquely to the whole of the exposure area by the projection lens 1, and the positional change of the spot on the four-division light-receiving elements 20A–20D is representative of the average inclination of the plane of the entire exposure area.

The plane parallel plates 21A and 21B do not exist in the parallel optical path, but exist between a lens 20E for condensing the reflected parallel light from the wafer or the mirror surface 3 and the four-division light-receiving elements 20A–20D disposed on the focal plane by the lens 20E. Also, the control circuit 17 suitably puts out a control signal to driving motors 41 and 42 for rotating the plane parallel plates 21A and 21B.

Figure 13A:
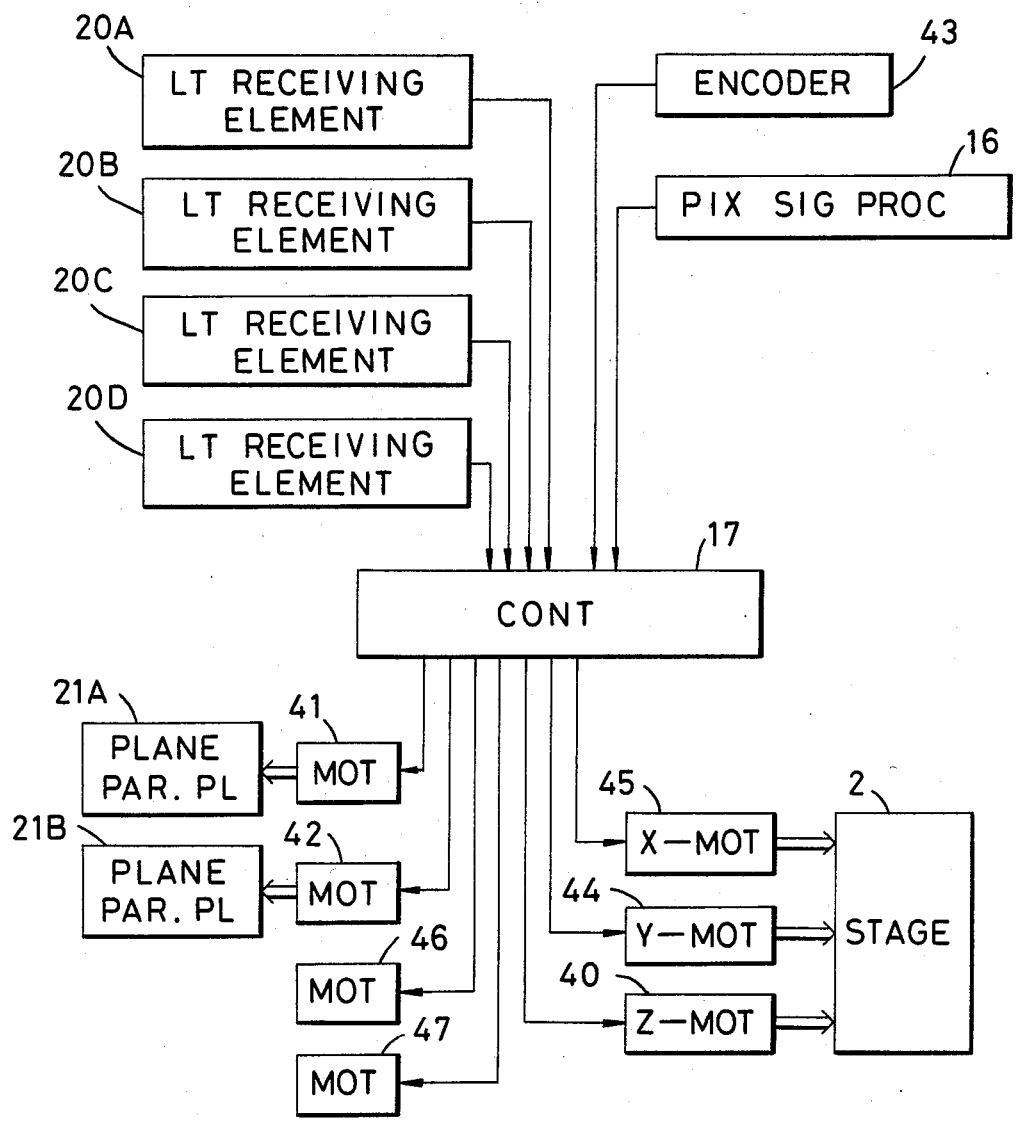
FIG. 13A is a block diagram showing some portions of the embodiment of the present invention.

In FIG. 13A, the control circuit 17 receives as inputs the outputs of the light-receiving elements 20A, 20B, 20C and 20D, the output of an encoder 43 which detects the amount of movement of the stage 2 in Z direction, and the output of the picture signal processing circuit. A motor 46 rotates the stage 2 about the x-axis, and a motor 47 rotates the stage 2 about the y-axis. A motor 45 moves the stage 2 in a direction along the x-axis, the motor 44 moves the stage 2 in a direction along the y-axis, and a motor 40 moves the stage 2 in Z direction.

The general operation of the above-described embodiment will now be described with reference to FIGS. 13A and 13B. At step 200, the stage 2 is positioned so that the parallel light beam emitted from the light-transmitting system 19 is reflected by the mirror surface 3 and enters the light-receiving system 20, and at step 201, adjustment is effected so that the outputs of the light-receiving elements 20A, 20B, 20C and 20D of the light-receiving system 20 are identical to one another.

Figure 12A:
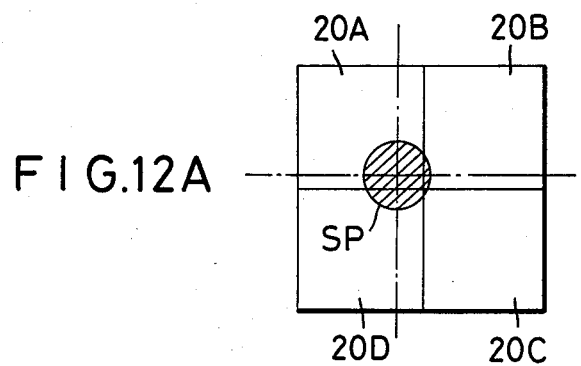
FIGS. 12A, 12B and 12C are plan views illustrating the operation in the embodiment of the present invention.
Figure 12B:
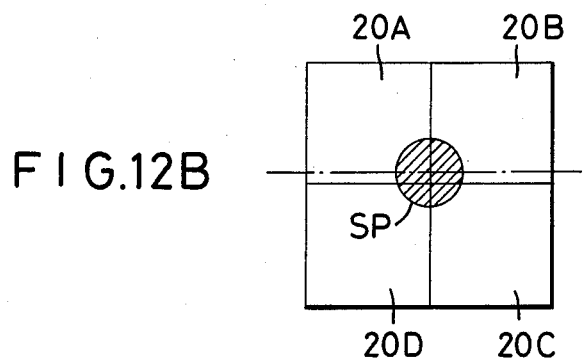

This will hereinafter be described with reference to FIGS. 12A, 12B and 12C. As shown in FIG. 13C, at step 300, X-motor 45 and the Y-motor 44 are driven. At steps 301 and 302, the spot SP is positioned on the four-division light-receiving elements 20A–20D as shown in FIG. 12A at a point of time whereat the stage 2 is positioned on the XY coordinates system so that the mirror surface 3 can be detected by leveling sensors 19 and 20.

Subsequently, as shown in FIG. 13D, at step 303, the motor 42 is driven, whereby the inclination of the plane parallel plate 21B is adjusted so that at steps 304 and 305, the outputs A, B, C and D of the light-receiving elements 20A to 20D (see FIG. 11) are $(A+D)-(B+C)=0$. The states after this adjustment is as shown in FIG. 12B. At step 306, the motor 41 is driven, whereby the inclination of the plane parallel plate 21A is adjusted so that at steps 307 and 308, $(A+B)-(C+D)=0$. Thereby, zero point correction is accomplished as shown in FIG. 12C. The them amounts of inclination (angles) of the plane parallel plates 21A and 21B are memorized as initial values.

Then, at step 202, the stage 2 is eleveted by the motor 40 while the position thereof is measured by sensor means shown in the encoder 43, so that at steps 203 and 204, the contrast of the image of the mark 9 on the reticle R is maximum. The device shown in FIG. 6 is utilized for this adjustment. Assuming that the point at which the contrast of the image of the mark 9 is maximum is QA, the position of the mark 11 opposed to the mark 9 is QC. At step 205, the position of the point QA in Z direction is detected. Here, it is to be understood that the mirror surface 3 is inclined with respect to the horizontal plane of movement LP of the stage 2, and the plane parallel to the mirror surface 3 and containing the point QA is RP. The inclination of the plane RP with respect to the plane of movement LP is an angle $\alpha$.

Next, when the stage 2 is further elevated at step 206, the contrast of the image of the mark 11 becomes maximum at a position QB by steps 208 and 209. At step 210, the distance $\overline{BC}$ of vertical movement (the distance between the positions QB and QC) is found from the then amount of movement of the stage 2 in a direction perpendicular to the plane of movement LP. This amount of movement is calculated in accordance with the output of the encoder 43. On the other hand, the distance between the marks 9 and 11 is known from the data during the designing. When this distance is L, $$\Psi \approx \overline{BC}/L \qquad (1)$$

At step 211, the angle $\Psi$ is calculated. At step 212, the zero point correction device 21 is rotatively adjusted so that the spot SP shifts in the reverse direction, i.e., the direction of $-(\alpha+\beta)$ until there is obtained an output corresponding to $$\Psi = -\overline{BC}/L \qquad (2)$$

Figure 12C:
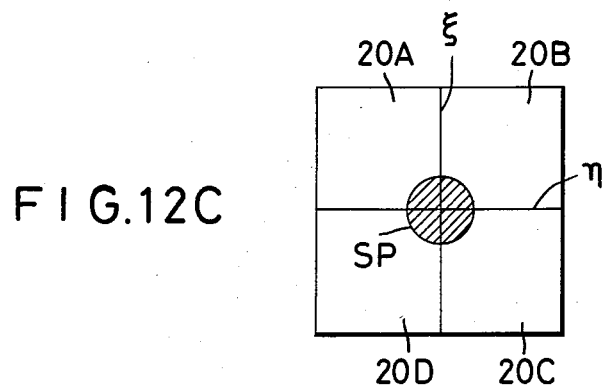

That is, the offset shown in equation (2) is applied to the light-receiving system 20 which is in the zero point state as shown in FIG. 12C. The relation between the outputs of the four-division light-receiving elements 20A-20D and the angles of rotation of the plain parallel plates 21A, 21B of the zero point correction device 21 is found in advance as a table in the processing circuit 17, and this is utilized to effect said adjustment.

Subsequently, at step 213, the motors 46 and 47 are controlled so that the wafer surface, i.e., the mirror surface 3, is coincident with the image plane, i.e., the plane FP containing the points QA and QB of FIG. 8. As shown in the flow set of FIG. 13D, the motors 46 and 47 are controlled and the offset shown in equation (2) is already applied and therefore, if the posture of the stage 2 is adjusted so that the mirror surface 3 becomes parallel to the image plane FP, the light-receiving system 20 will assume the zero point state. The subroutine of step 213 is one in which the motor 42 of FIG. 13D is replaced by the motor 46 and the motor 41 is replaced by the motor 47.

That is, at step 213, the outputs of the light-receiving elements 20A, 20B, 20c and 20D are made equal to one another.

In other words, the light-receiving system 20 as second detecting means is first set to the state of "0" by the mirror surface 3 on the stage 2, and then the angle of inclination $\Psi(\overline{BC}/L)$ is detected by the TTL alignment optical systems 4A, 4B as first detecting means and the device for measuring the amount of vertical movement of the stage 2, and the offset of the angle of inclination $(-\overline{BC}/L)$ in the opposite directionis introduced as a calibrated value into the angles of rotation of the plane parallel plates 21A, 21B as calibrating means.

Thus, even if the mirror surface 3 is inclined with respect to the plane of movement LP, the light-receiving system 20 is calibrated so as to detect a plane parallel to the imaging plane FP always as the zero point. Also, in FIG. 8, the reticle R is shown as being perpendicular to the optic axis AX and the imaging plane FP also is shown as being perpendicular to the optic axis AX, but such setting is not always necessary. That it, where the reticle R is slightly inclined with respect to the optic axis AX, the image plane on which the projected images of the openings 5, 6, 7 and 8 of the reticle R by the projection objective 1 are formed is also slightly inclined with respect to the optic axis AX instead of being perpendicular thereto. However, even in such a case, the light-receiving system 20 is calibrated so as to assume the zero point when the projected image plane of the reticle R becomes parallel to the wafer surface.

Now, the foregoing example has been described with respect to a case where the two marks 9 and 10 are used, but a similar situation will also hold true even if the marks are two-dimensionally expanded. The inclination (angle) of the plane can be found from the positional relation between three points on the plane.

Figure 14:
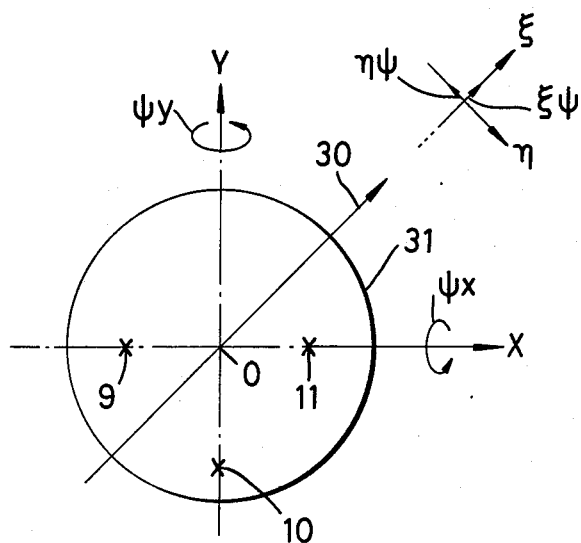
FIG. 14 shows a portion of a second embodiment of the present invention.

For example, as shown in FIG. 14, the marks on the mirror surface 3 which are the objects of TTL focus measurement (see FIG. 8) are designated by 9, 10 and 11, and the optic axis of off-axis auto-leveling sensors 19 and 20 is denoted by 30. In FIG. 14, the original 0 of the coordinates system XY is a point at which the optic axis 30 intersects the optic axis AX of the projection objective 1, and a circular area 31 is the image field. The angular offset thereof relative to the optic axis 30 is generally given as $\zeta\Psi$ and $\eta\Psi$ in two directions, for example, axes $\zeta$ and $\eta$. $\zeta$ and $\eta$ are the coordinates axes on the four-division light-receiving elements 20A-20D (see FIG. 12C).

In FIG. 14, for example, the inclination $\Psi x$ about the X-axis and the inclination by about the Y-axis can be found from the plane formed by the marks 9, 10 and 11 to be measured. To project these inclinations $\Psi x$ and $\Psi y$ onto the planes $\zeta$ and $\eta$, for example, the general equation of angular conversion is used.

In the manner described above, the inclination of the exposed area on the wafer during the actual exposure is detected by only the calibrated autoleveling sensors 19 and 20 (second detecting means), whereby the posture of the stage 2 can be adjusted.

Also, in the above-described embodiment, one-axis autoleveling sensors 19 and 20 are used, but even if a multipoint measuring non-TTL system such as injected air is used as second detecting means, the absolute value calibration or the like in the auto chip leveling for a plurality of chips on the wafer can be likewise accomplished.

Figure 15:
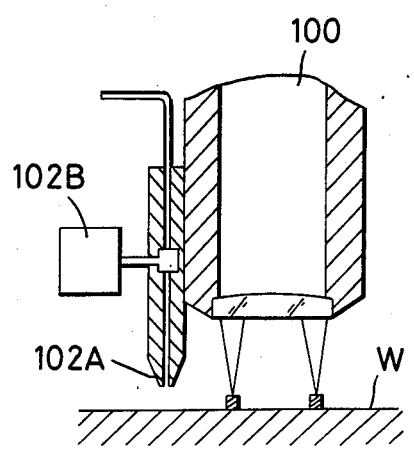
FIGS. 15 and 16 show a third embodiment of the present invention.
Figure 16:
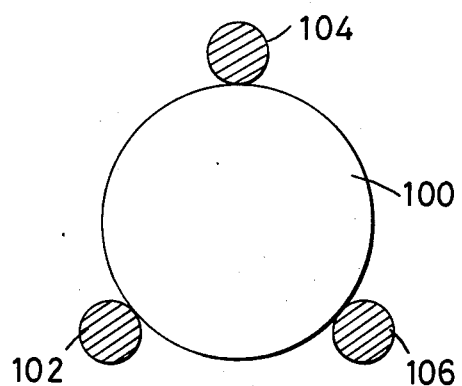

More perticularly, as shown in FIG. 16, air micro type auto-focus detecting portions 102, 104 and 106 are provided around a projection lens 100. These detecting portions 102, 104 and 106 are designed such that, as shown, for example, in FIG. 15, gas of predetermined pressure is injected from a nozzle 102A to the wafer surface W and that any variation in the back pressure of this gas can be detected by a sensor 102B. When said back pressure is smaller than a predetermined value, the spacing between the tip end of the nozzle 102A and the wafer surface W becomes too great, and when said back pressure is greater than the predetermined value, said spacing becomes too small. Accordingly, by the three air micro type auto-focus detecting portions 102, 104 and 106 being provided around the projection lens 100, the inclination of the wafer surface can be detected. That is, the back pressure sensor outputs of the detecting portions 102, 104 and 106 are monitored and if all these are identical to one another, it means that the wafer surface W is coincident with or parallel to the image plane.

Accordingly, by applying suitable offset to the individual back pressure sensors, calibration can be accomplished.

Further, in the embodiment shown in FIG. 8, the parallel planar glass is rotated to thereby accomplish calibration, but alternatively, calibration may be accomplished by the following methods.

A first method is to memorize the output of the leveling sensor on which light is obliquely incident, i.e., the outputs of the four-division light-receiving elements 20A–20D, when the combined angle of the angles $\beta$ and $\alpha$ has been detected by the TTL system, and them convert the memorized value electrically or in the fashion of software so that it becomes the reference value during the leveling measurement of the wafer surface. In this case, when the output of the leveling sensor light receiving system 20 when the wafer surface is actually measured is the same as the memorized value, the imaging plane and the wafer surface become coincident with each other.

A second method is to mechanically incline the mirror surface 3 by an angle converse to the combined angle of the angles $\alpha$ and $\beta$ at a point of time whereat said combined angle has been detected by the TTL system. At this time, the inclination of the mirror surface 3 is mechanically servo-controlled so that the leveling sensor may assume the zero point before the calibration.

In any of the above-described embodiments, the mirror surface 3 is a reference mark plate and is provided on the stage 2 substantially in parallelism to the supporting surface of a holder for chuking the wafer, and need not be completely parallel to the supporting surface of the holder.

While the above-described embodiments of the present invention have the projection lens 1, the present invention is also applicable to an apparatus such as an X-ray exposure apparatus including no projection lens.

What we claimed is:

1. A projection optical apparatus for projecting the pattern of a mask onto a substrate through a projection optical system, including:

a stage for supporting thereon a substrate having a plurality of marks for detection on the surface thereof;

first detecting means for detecting the amount of inclination of the surface of said substrate relative to the surface on which said pattern is projected and imaged, through said projection optical system;

second detecting means for detecting the amount of inclination of the surface of said substrate relative to a predetermined reference plane independently of said projection optical system; and calibrating means for calibrating the amount of inclination detected by said second detecting means on the basis of the amount of inclination detected by said first detecting means.

2. A projection optical apparatus according to claim 1, wherein said first detecting means includes a TTL detecting optical system having a light-receiving device capable of detecting the surface on which said pattern is projected and imaged, through said mask and said projection optical system, and detecting said marks for detection on said substrate.

3. A projection optical apparatus according to claim 1, wherein said second detecting means includes a projection device for projecting a light beam onto said substrate, and a light-receiving device having a converging optical system for converging the reflected light beam reflected from the surface of said substrate to thereby form a light spot, and a light-receiving element for detecting the position of said light spot.

4. A projection optical apparatus according to claim 3, wherein said calibrating means includes a pair of rotatable plain parallel plates provided on the light-receiving optical path of said light-receiving device to displace said light spot.

5. A projection optical apparatus according to claim 1, wherein said second detecting means is at least three air micro type position detecting devices provided around said projection optical system, and the back pressure of the air of each of said air micro type position detecting devices is calibrated by said calibrating means.

* * * * *